(12) United States Patent
Wan et al.

(10) Patent No.: US 9,129,987 B2
(45) Date of Patent: Sep. 8, 2015

(54) REPLACEMENT LOW-K SPACER

(71) Applicant: GLOBALFOUNDRIES Inc., Grand Cayman (KY)

(72) Inventors: Jing Wan, Malta, NY (US); Jin Ping Liu, Ballston Lake, NY (US); Guillaume Bouche, Albany, NY (US); Andy Wei, Queensbury, NY (US); Lakshmanan H. Vanamurthy, Albany, NY (US); Cuiqin Xu, Malta, NY (US); Sridhar Kuchibhatla, Malta, NY (US); Rama Kambhampati, Albany, NY (US); Xiuyu Cai, Niskayuna, NY (US)

(73) Assignee: GLOBAL FOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 14/163,687

(22) Filed: Jan. 24, 2014

(65) Prior Publication Data
US 2015/0214330 A1    Jul. 30, 2015

(51) Int. Cl.
| H01L 29/66 | (2006.01) |
| H01L 21/3105 | (2006.01) |
| H01L 21/311 | (2006.01) |
| H01L 21/28 | (2006.01) |

(52) U.S. Cl.
CPC .... *H01L 29/66545* (2013.01); *H01L 21/28079* (2013.01); *H01L 21/28088* (2013.01); *H01L 21/31055* (2013.01); *H01L 21/31111* (2013.01)

(58) Field of Classification Search
CPC ............ H01L 29/6656; H01L 29/6653; H01L 21/28088; H01L 21/28079; H01L 29/66545
See application file for complete search history.

(56) References Cited

U.S. PATENT DOCUMENTS

| 7,838,373 B2 | 11/2010 | Giles et al. | |
| 2009/0001480 A1* | 1/2009 | Cheng | 257/387 |
| 2011/0260258 A1* | 10/2011 | Zhu et al. | 257/369 |

* cited by examiner

*Primary Examiner* — Caleb Henry
*Assistant Examiner* — Mounir Amer
(74) *Attorney, Agent, or Firm* — Heslin Rothenberg Farley & Mesiti P.C.

(57) ABSTRACT

A method includes providing a gate structure having a gate, a first spacer along at least one side of the gate and an interlayer dielectric on at least one of the gate and the first spacer. The interlayer dielectric is removed to reveal the first spacer. The first spacer is removed and a second spacer is deposited on at least one side of the gate. The second spacer is formed of material having a lower dielectric constant than the first spacer.

15 Claims, 7 Drawing Sheets

REPLACEMENT LOW-K SPACER

FIELD OF THE INVENTION

The present invention generally relates to semiconductor devices and methods of fabricating semiconductor devices, and more particularly, to methods of fabricating gate structures for semiconductor devices.

BACKGROUND OF THE INVENTION

A finished gate structure (such as a finished gate or transistor gate) is the transistor terminal that modulates channel conductivity. Two principle approaches for forming semiconductor device gate structures are the gate-first and gate-last process approaches.

During fabrication of gate structures for, for instance, complementary metal-oxide-semiconductor (CMOS) technology, gate-first fabrication has traditionally been employed. In a gate-first fabrication approach, a conductor is provided over a gate dielectric, and then patterned (i.e., etched) to form one or more gate structures. After forming the gate structures, source and drain features of the semiconductor devices are provided.

As transistors continue to decrease in size and the number of transistors per unit of microchip grows, a MOSFET pitch of the transistors scales down (e.g., under 22 nm) and a thickness of a SiN spacer of a gate structure also scales to provide a large enough contact area for a source/drain thereof. However, such a thinner spacer induces higher parasitic capacitance which is undesirable because such high capacitance can reduce a circuit speed. The parasitic capacitance of the circuit increase may cause slower ring oscillator (RO) speed and eventually lower circuit working frequency. With higher effective capacitance (CEFF) of RO, circuit ac performance may degraded and there may be more power consumption during dynamic operation.

More recently, the gate-last approach (or replacement metal gate (RMG) approach), has been employed. In the gate-last approach, a sacrificial (or dummy) gate material is provided and patterned (i.e., etched) to define one or more sacrificial gates. The one or more sacrificial gates are subsequently replaced with, for instance, a metal gate, after source and drain features of the devices have been formed. The sacrificial gate material holds the position for the subsequent metal gate to be formed. For instance, an amorphous silicon (a-Si) or polysilicon sacrificial gate may be patterned and used during initial processing until high-temperature annealing to activate the source and drain features has been completed. Subsequently, the a-Si or polysilicon may be removed and replaced with the final metal gate.

Accordingly, a need exists for improved systems and methods for forming semiconductor device gate structures to reduce parasitic losses.

BRIEF SUMMARY

The shortcomings of the prior art are overcome and advantages are provided through the provision, in one aspect, of a method which includes providing a gate structure having a gate, a first spacer along at least one side of the gate and an interlayer dielectric on at least one of the gate and the first spacer. The interlayer dielectric is removed to reveal the first spacer. The first spacer is removed and a second spacer is deposited on at least one side of the gate. The second spacer is formed of material having a lower dielectric constant than the first spacer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions, and/or arrangements within the spirit and/or scope of the underlying inventive concepts will be apparent to those skilled in the art from this disclosure.

Figure 1:
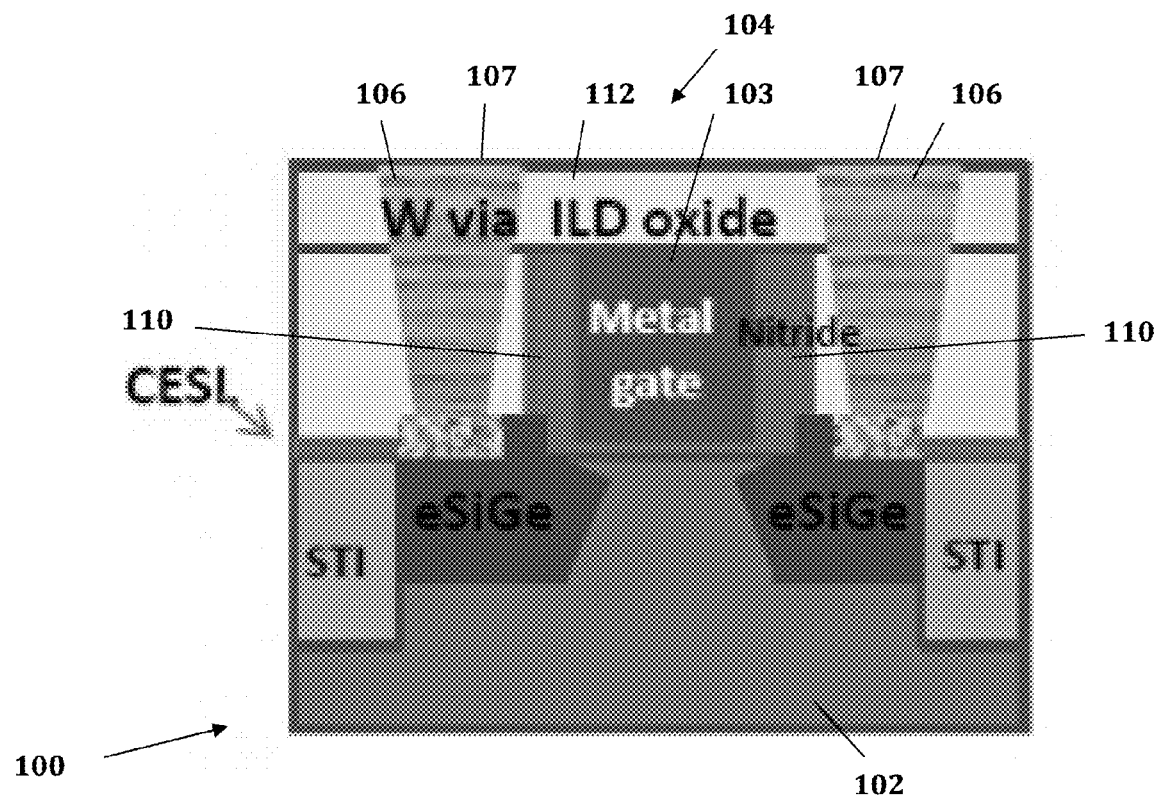
FIG. 1 is a partial elevational view of an example of a intermediate structure obtained after contact formation of a semiconductor fabrication process, in accordance with one or more aspects of the present invention.

Referring to FIG. 1, a partial side elevational view of an intermediate structure obtained during gate-last fabrication (e.g., of a replacement metal gate (RMG) less than 45 nm) a semiconductor device, such as a semiconductor device comprising multiple MOSFETs, is depicted. An intermediate structure 100 includes a substrate 102 which may be a silicon substrate. A gate structure 104 is illustrated after a Middle of Line (MOL) (e.g., after trench silicidation and trench contact formation) of a gate-last semiconductor device fabrication approach. In one embodiment gate structure 104 may include a metal gate 103 which is located above substrate 102. Two contact trenches 106 may be located on opposite sides of gate 103 of gate structure 104. Shallow trench isolations 117 are located outside each of contact trenches 106 and stressors 118 are located below each of contact trenches 106.

An initial spacer 110 (e.g., a nitride spacer) may be located on opposite vertical sides 105 of gate 103 between the gate and the contact trenches. An interlayer dielectric 112 (e.g., a low-k material) may be located above gate 103 and top ends 107 of contact trenches 106.

Figure 2:
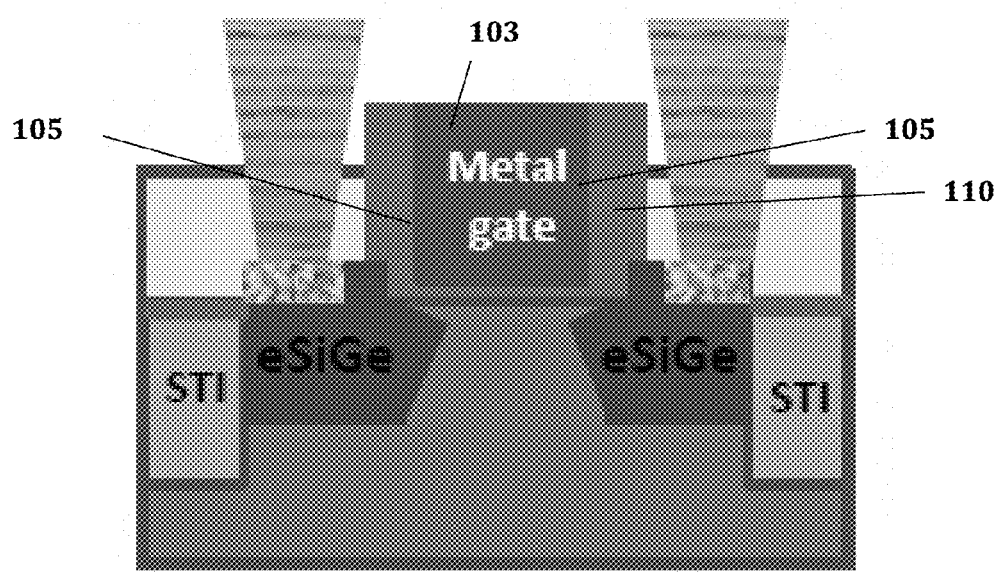
FIG. 2 depicts the intermediate structure of FIG. 1 after removal of an interlayer dielectric.

The various layers and structures of intermediate structure 100 depicted in FIG. 1 may be formed using a variety of different materials, and a variety of fabrication techniques, such as chemical-vapor deposition (CVD), atomic layer deposition (ALD), physical vapor deposition (PVD), or plasma-enhanced versions of such processes. The thicknesses of the depicted structures and layers may also vary, depending upon the particular application As illustrated in FIG. 2, one or more process operations (e.g., wet or dry etching) may be performed to remove interlayer dielectric 112 to expose initial spacer 110, gate 103 and contact trenches 106. In one illustrative example, interlayer dielectric 112 may be removed by wet chemical and dry etch process, such as reactive ion etching using fluorine-based chemistry involving process gases such as tetrafluoromethane ($CF_4$), trifluoromethane ($CHF_3$), sulfur hexafluoride ($SF_6$).

Figure 3:
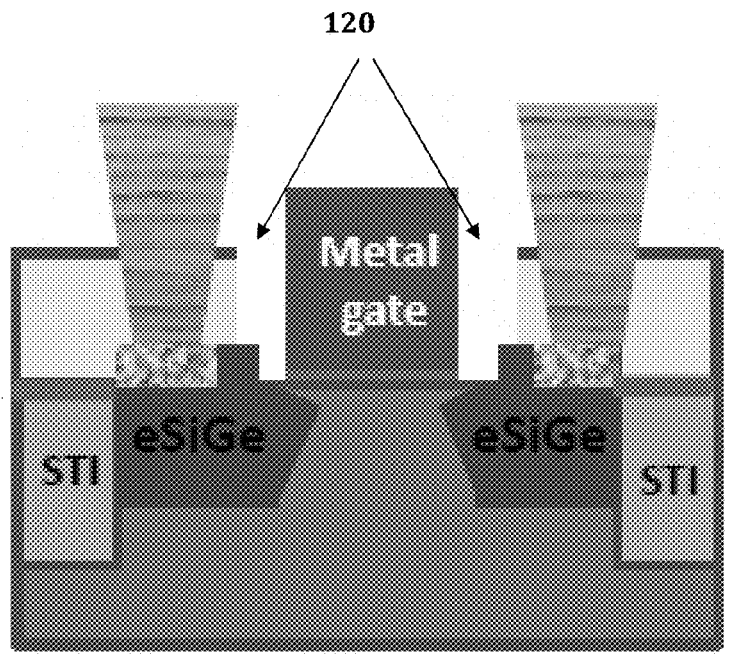
FIG. 3 depicts the intermediate structure of FIG. 2 after removal of a first spacer.
Figure 4:
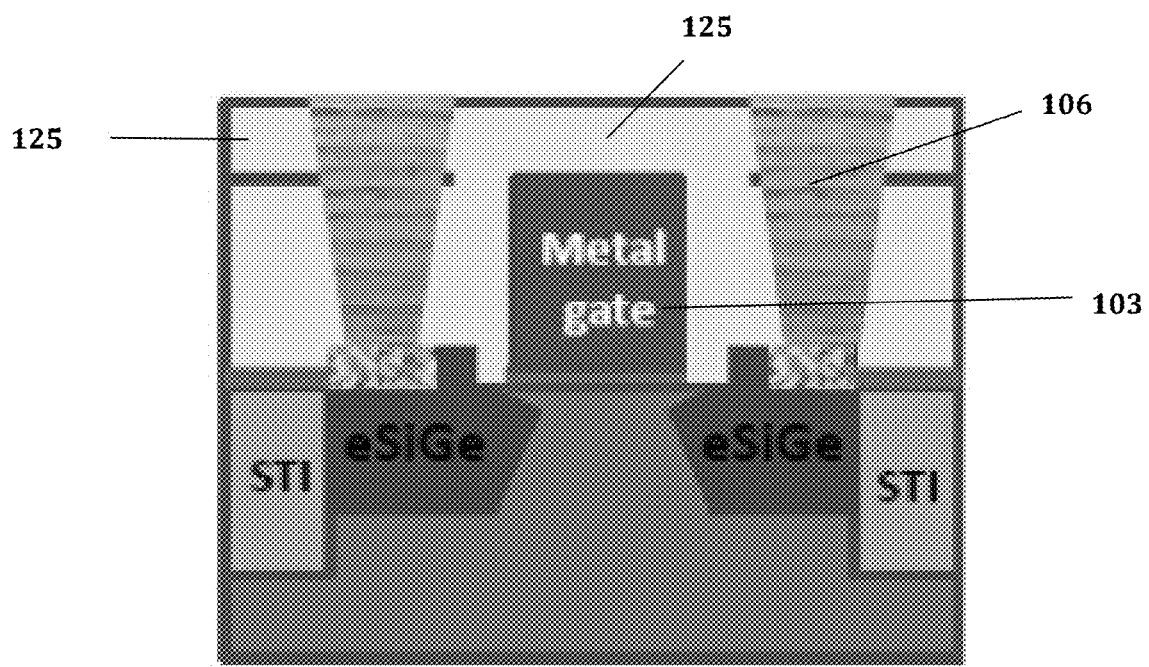
FIG. 4 depicts the intermediate structure of FIG. 3 after a second spacer is deposited on a side of the gate.
Figure 5:
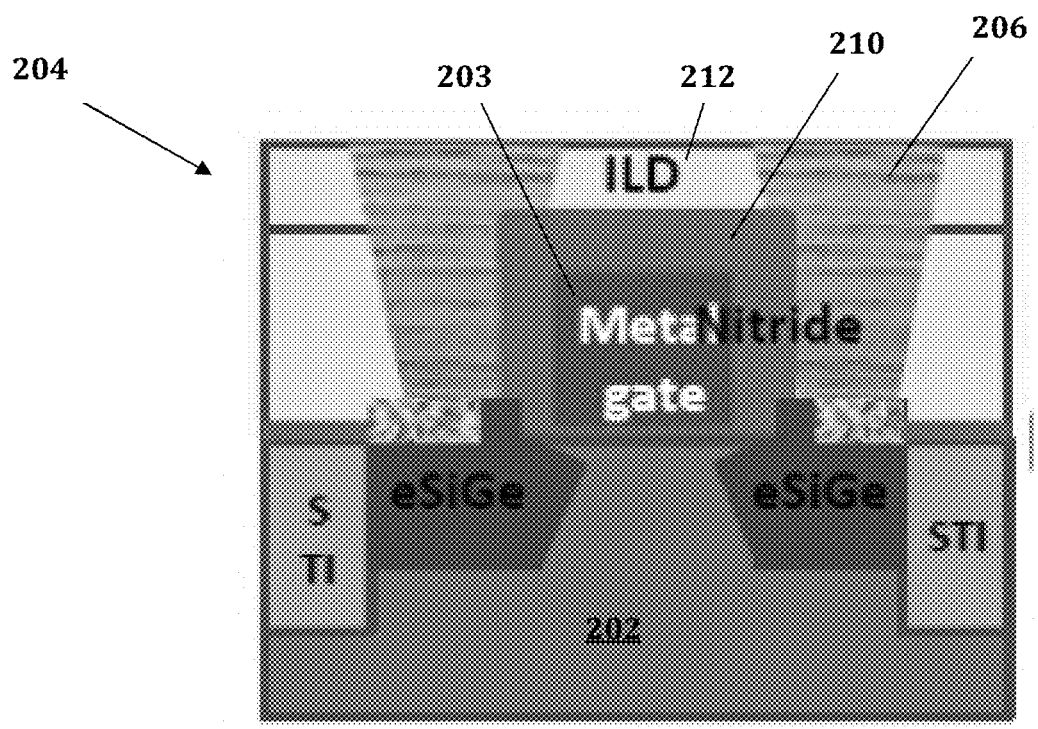
FIG. 5 is a partial elevational view of an example of an intermediate structure obtained using self-aligned contact of a semiconductor device fabrication process, in accordance with one or more aspects of the present invention.

As depicted in FIG. 3, initial spacer 110 may be removed from vertical sides 105 of gate 103 by wet etching to reveal a space 120 around three sides (i.e., the top and vertical sides) of gate 103 located above a substrate 102 (e.g., a silicon substrate). As depicted in FIG. 4, space 120 may be filled (e.g., using a spin-on or CVD process) with a second spacer 125, e.g., formed of an oxide or other low-k materials, such as a flowable oxide, e.g. like flowable chemical vapor deposition (FCVD). Gate structure 104 may then be subjected to chemical mechanical planarization which stops at the topmost extent of the contact trenches. During the deposition of the second spacer, a temperature of gate structure 104 may be controlled to avoid degrading the silicide formed between contact trenches 106 and substrate 102.

The above described removal of initial spacer 110 and deposition of second spacer 125 allows the first spacer to be present during the processes including steps of etching, epitaxy and through annealing in FEOL (Front end of line) modules. As indicated, initial spacer 110 is then replaced by second spacer 125 formed of low-k materials (e.g., SiO2, SiBCN or SIOCN). This allows for less demand and more options on the low-k materials of the second spacer and there is less degradation in downstream processes. For example, the second spacer need not be a good protection layer for selective epitaxy, or stable under high thermal budget (e.g., a temperature of 700° C.) because these processes are performed while initial spacer 110 is present on gate structure 104. Also, second spacer 115 may have less demand on its selectivity to SiO2 and Si, because the second spacer does not have to experience any selective etching process. Instead, the first sacrificial spacer is present during the process. Thus, the second spacer may have a k-value low enough to reduce capacitance relative to initial spacer 110, such as an oxide having K value of about 3.9.

Figure 6:
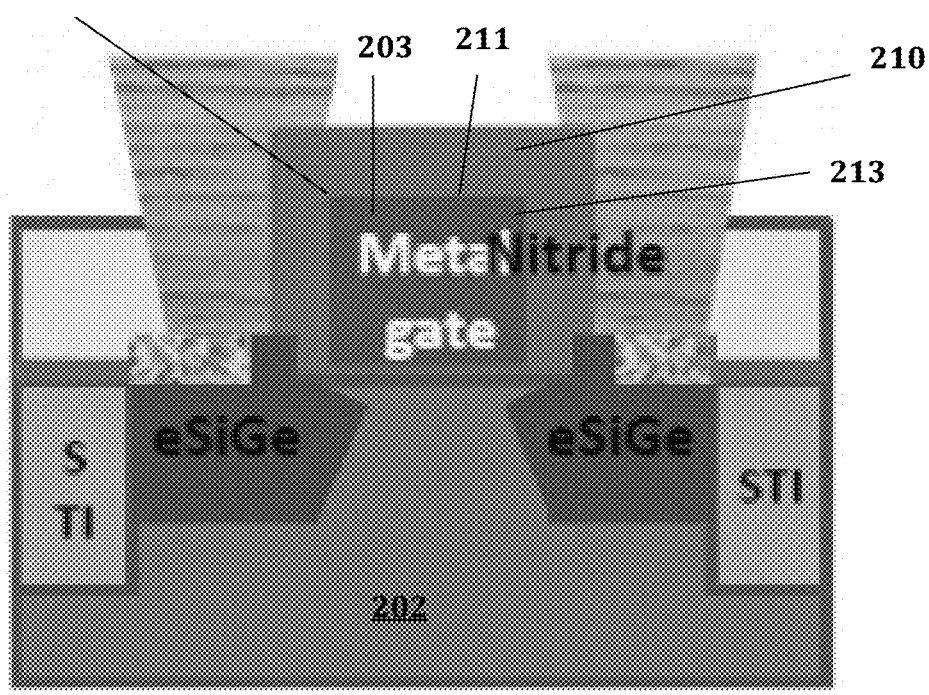
FIG. 6 depicts the intermediate structure of FIG. 5 after the removal of an interlayer dielectric to reveal a first spacer.

In another example depicted in FIGS. 5-8 and similar to that described above, an initial spacer 210 of a gate structure 204 may be removed and a second spacer 215 may be deposited in the case of a process according to a self aligned contact of a gate-last semiconductor device fabrication approach. As illustrated in FIG. 6, one or more process operations (e.g., wet or dry etching) may be performed to remove an interlayer dielectric 212 to expose initial spacer 210, a gate 203 and contact trenches 206. Initial spacer 210 covers a top 211 and two vertical sides 213 of gate 203. In one illustrative example, interlayer dielectric 212 may be removed by wet chemical and dry etch process, such as reactive ion etching using fluorine-based chemistry involving process gases such as tetrafluoromethane ($CF_4$), trifluoromethane ($CHF_3$), sulfur hexafluoride ($SF_6$).

Figure 7:
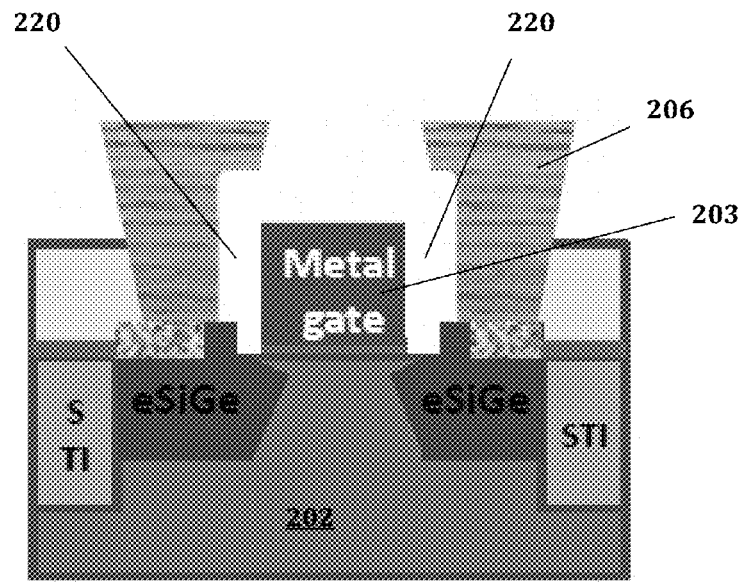
FIG. 7 depicts the intermediate structure of FIG. 6 after the removal of the first spacer.
Figure 8:
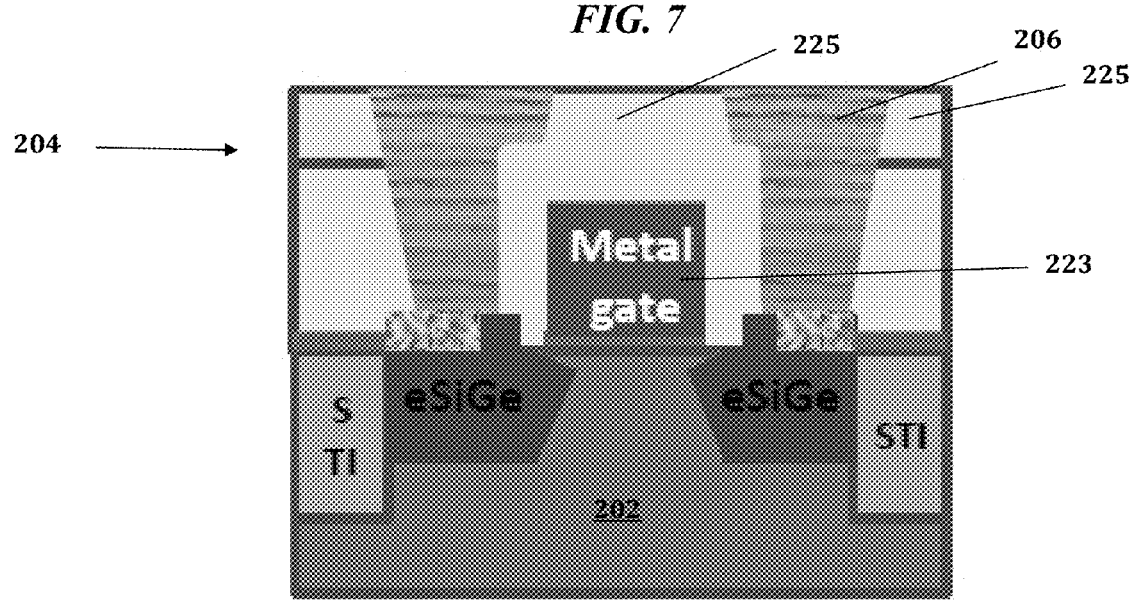
FIG. 8 depicts the intermediate structure of FIG. 7 after a second spacer is deposited.

As depicted in FIG. 7, initial spacer 210 may be removed by wet etching to reveal a space 220 around three sides (i.e., the top and vertical sides) of gate 203. As depicted in FIG. 8, space 220 may be filled with a second spacer 225, e.g., an oxide or other low-k materials, such as a flowable oxide, e.g., via flowable chemical vapor deposition (FCVD) or other flowable materials. Gate structure 204 may then be subjected to chemical mechanical planarization which stops at the topmost extent of the contact trenches. During the deposition of the second spacer, temperature may be controlled to avoid degrading the silicide formed between contact trenches 206 and substrate 202.

Figure 9:
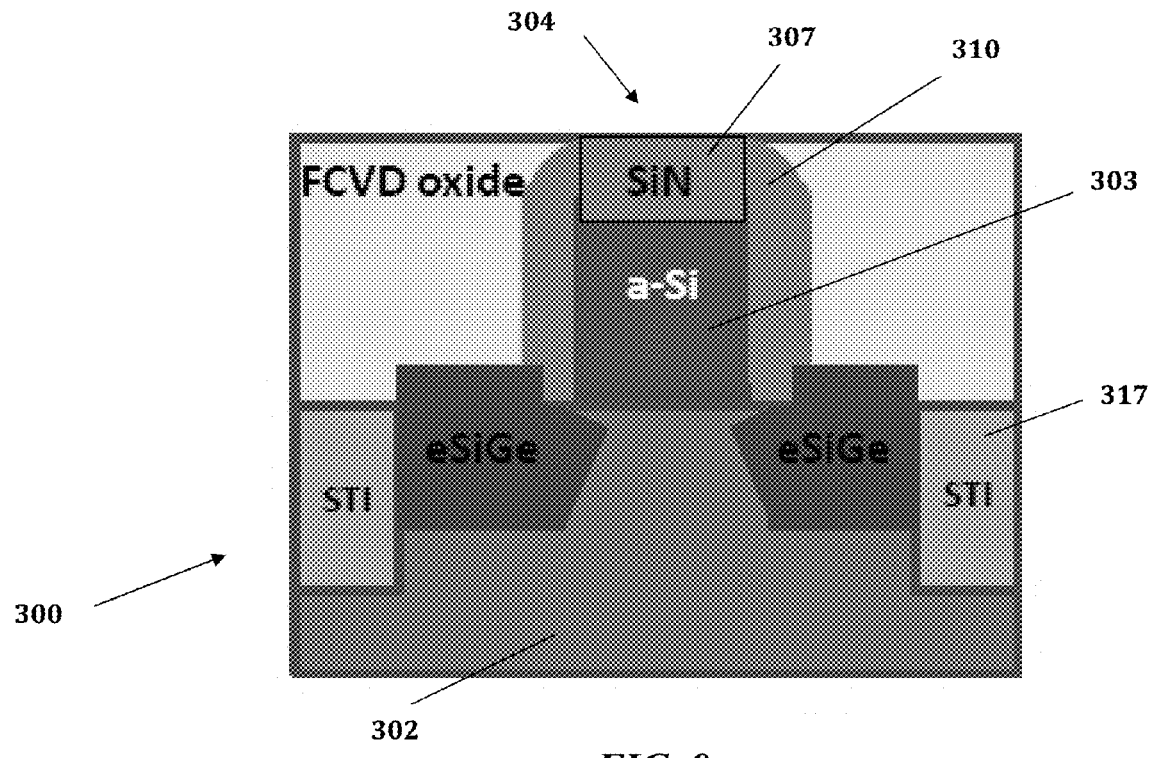
FIG. 9 is partial elevational view of an example of an intermediate structure obtained after a poly-open chemical mechanical planarization process of a semiconductor device fabrication process, in accordance with one or more aspects of the present invention.

In a further example, depicted in FIGS. 9-14, and similar to that described above, an initial spacer 310 of a gate structure 304 may be removed and a second spacer 315 may be deposited in the case of a process according to process integrating a replacement metal gate method using trench silicidation of a semiconductor fabrication process. As illustrated in FIG. 9, an intermediate structure 300 obtained during gate-last fabrication of a semiconductor device, such as a semiconductor device comprising multiple MOSFETs, after a poly open chemical mechanical planarization is depicted. Intermediate structure 300 includes a substrate 302, which may be a silicon substrate. A gate structure 304 is illustrated, which includes an amorphous silicon dummy gate 303 surrounded on three sides by spacer 310 which may be made of silicon nitride. Shallow trench isolations 317 are located outside stressors 318 located below gate 303.

Figure 10:
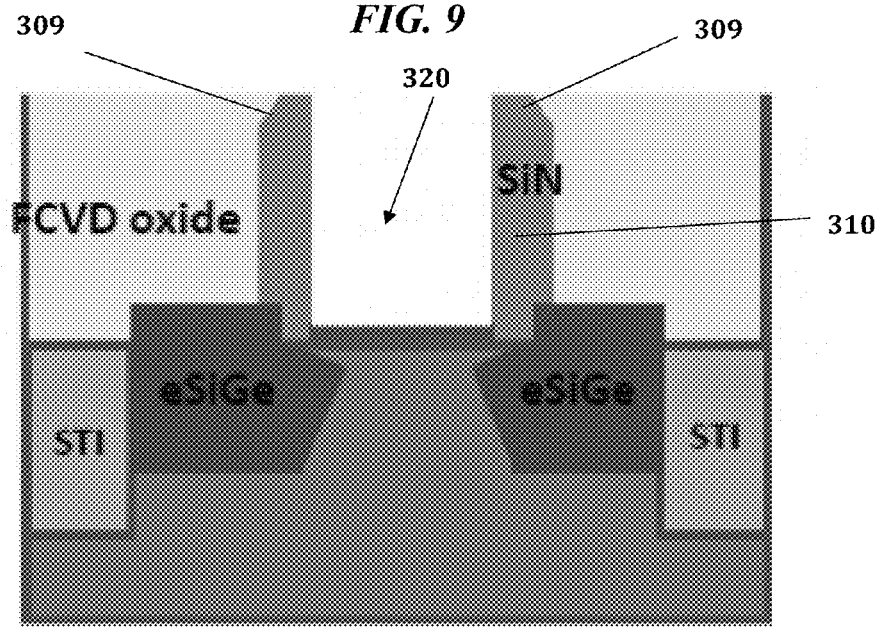
FIG. 10 depicts the intermediate structure of FIG. 9 after the removal of an a-Si dummy gate.
Figure 11:
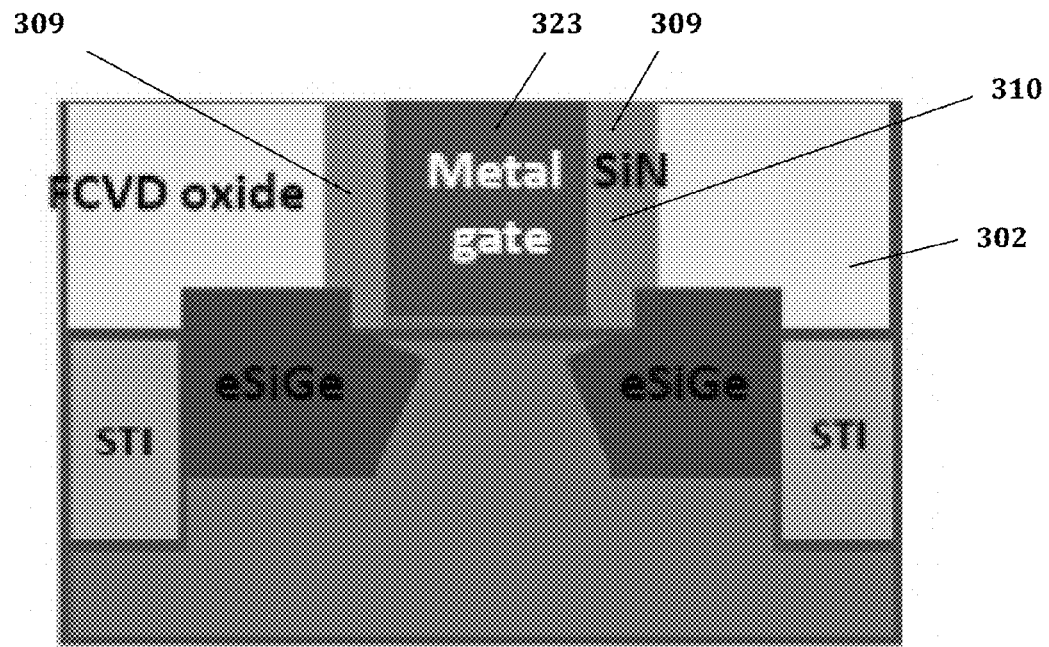
FIG. 11 depicts the intermediate structure of FIG. 10 after a metal gate deposition and chemical mechanical planarization.

One or more process operations (e.g., wet or dry etching) may be performed to remove a top horizontal side 307 of spacer 310 and gate 303 to result in a space 320 bounded on opposite lateral sides by vertical sides 309 of spacer 310 as depicted in FIGS. 9-10. For example, horizontal side 307 of spacer 310 and gate 303 may be removed by wet chemical and dry etch process, such as reactive ion etching using fluorine-based chemistry involving process gases such as tetrafluoromethane ($CF_4$), trifluoromethane ($CHF_3$), sulfur hexafluoride ($SF_6$). Metal may be deposited in cavity 320 to form a metal gate 323 as depicted in FIG. 11.

Figure 12:
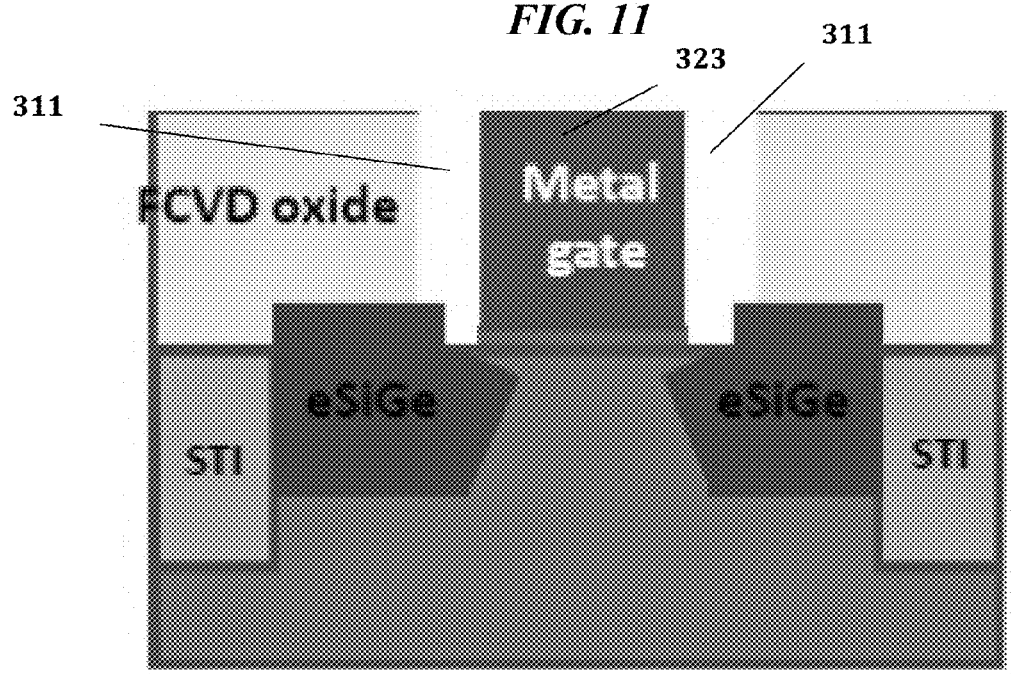
FIG. 12 depicts the intermediate structure of FIG. 11 after a spacer is removed around the gate.

Vertical sides 309 of spacer 310 may be removed by wet chemical and dry etch process, such as reactive ion etching using fluorine-based chemistry involving process gases such as tetrafluoromethane ($CF_4$), trifluoromethane ($CHF_3$), sulfur hexafluoride ($SF_6$) such that spaces 311 are located on opposite lateral sides of gate 323 as depicted in FIG. 12.

Figure 13:
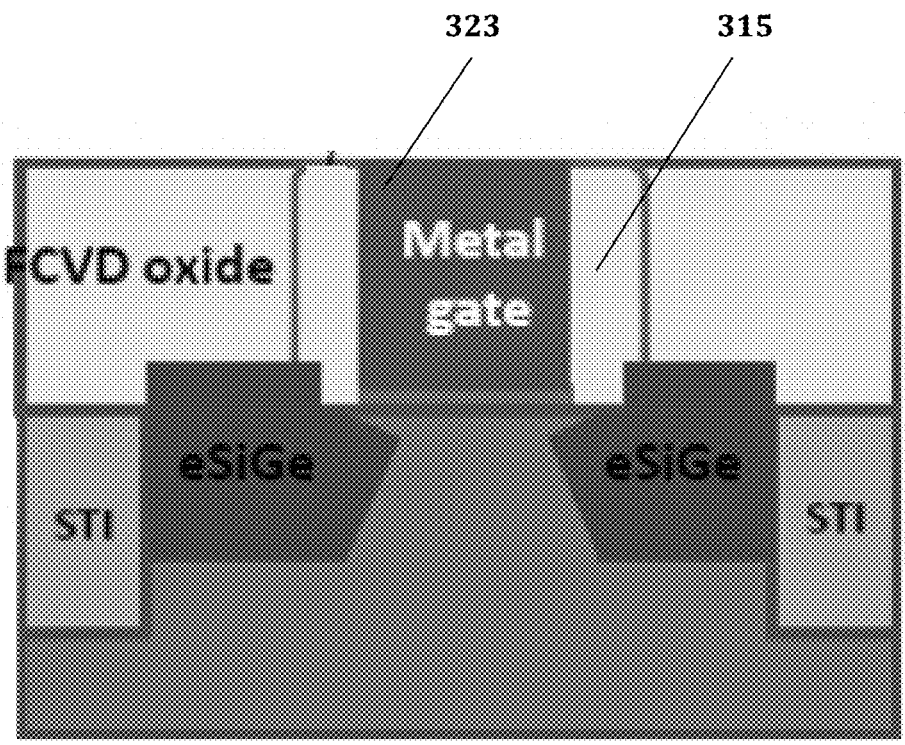
FIG. 13 depicts the intermediate structure of FIG. 12 after a low-K spacer is deposited.
Figure 14:
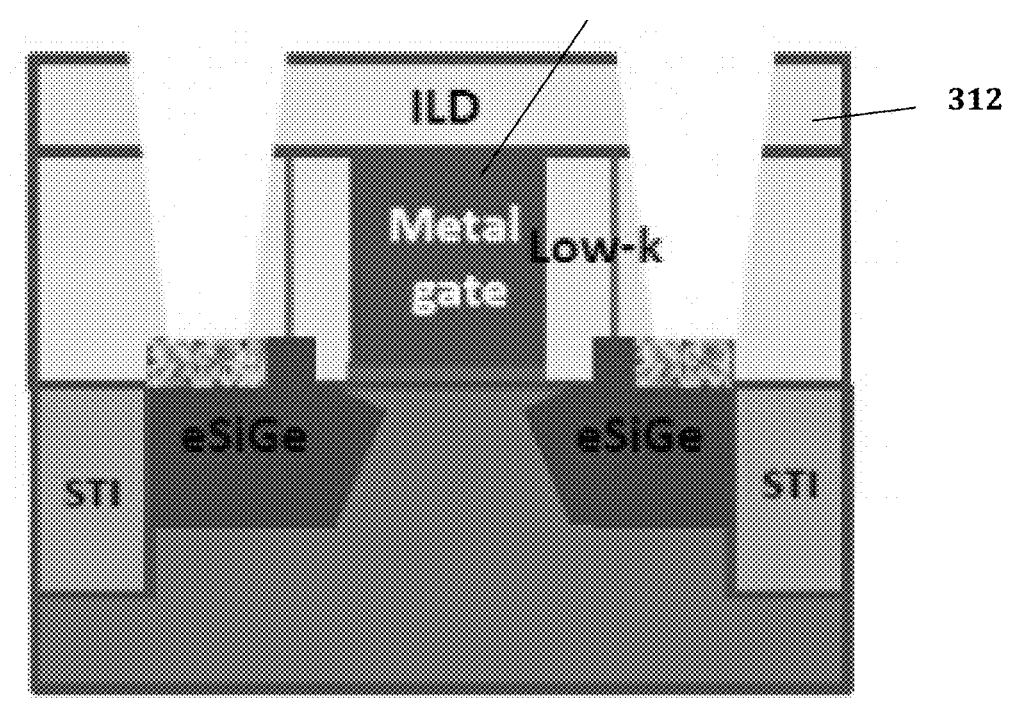
FIG. 14 depicts the intermediate structure of FIG. 4 after the deposition of an interlayer dielectric and an opening of trench for a silicidation contact.

As depicted in FIG. 13, spaces 311 may be filled with a second spacer 315, e.g., formed of an oxide or another low-k material (e.g., or SiBCN, SiOCN), such as a flowable oxide (e.g. via flowable chemical vapor deposition (FCVD) or other flowable materials. Gate structure 304 may then be subjected to chemical mechanical planarization followed by deposition of an interlayer dielectric 312 (e.g., a layer of an oxide) located above gate 323 and spacer 315. Contact trenches 306 may be opened as depicted in FIG. 14 to allow for the formation of silicidation contacts (e.g., at a Middle Of Line of the semiconductor fabrication process).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
   providing a transistor structure including a source, a drain, and a gate structure having a gate, a first spacer conformal to a top and vertical sides of the gate, an interlayer dielectric on the first spacer, and contact trenches adjacent to the vertical sides of the gate, wherein the gate structure, the first spacer and the interlayer dielectric disposed above the source and the drain;
   removing the interlayer dielectric to reveal the first spacer using the contact trenches as a mask to protect the source and the drain of the transistor structure;
   removing the first spacer conformal to the top and vertical sides of the gate; and
   depositing a second spacer conformal to the top and the vertical sides of the gate, the second spacer formed of a material having a lower dielectric constant than the first spacer.

2. The method of claim 1, wherein the providing the gate structure comprises providing a gate structure after a trench silicidation process is performed on the gate structure.

3. The method of claim 1, wherein the gate comprises a metal gate.

4. The method of claim 1, wherein the providing the gate structure comprises providing a gate structure after a middle of line point of a transistor manufacturing process.

5. The method of claim 1, wherein the providing the gate structure comprises providing a gate structure using a self-aligned contact process.

6. The method of claim 1, wherein the providing the gate structure comprises providing the gate structure after forming a contact trench.

7. The method of claim 1, wherein the first spacer comprises silicon nitride and the second spacer comprises one of SiO2, SiBCN or SIOCN.

8. The method of claim 1, wherein the removing the first spacer comprises removing the first spacer by wet etching.

9. The method of claim 1, wherein the removing the first spacer comprises removing the first spacer by chemical mechanical planarization.

10. The method of claim 1, wherein the depositing the second spacer comprises depositing the second spacer on the top and the vertical sides of the gate.

11. The method of claim 1, wherein the depositing the second spacer comprises depositing a flowable oxide.

12. The method of claim 1, further comprising removing a portion of the second spacer to expose a contact trench of the gate structure.

13. The method of claim 1, further comprising controlling a temperature of the gate structure to avoid degrading a silicide of the gate structure.

14. The method of claim 1, further comprising removing the gate and depositing a metal gate before the removing the first spacer.

15. The method of claim 1, wherein the depositing the second spacer comprises depositing the second spacer using one of chemical-vapor deposition (CVD), atomic layer deposition (ALD) and physical vapor deposition (PVD).

* * * * *